(12) United States Patent
Fan et al.

(10) Patent No.: US 11,563,496 B2
(45) Date of Patent: Jan. 24, 2023

(54) PHASE RESPONSE MEASUREMENT METHOD AND APPARATUS

(71) Applicant: Fujitsu Limited, Kawasaki (JP)

(72) Inventors: Yangyang Fan, Beijing (CN); Zhenning Tao, Beijing (CN)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 17/489,476

(22) Filed: Sep. 29, 2021

(65) Prior Publication Data
US 2022/0140912 A1    May 5, 2022

(30) Foreign Application Priority Data

Nov. 3, 2020 (CN) .......................... 202011209286.6

(51) Int. Cl.
*H04B 10/00* (2013.01)
*H04B 10/50* (2013.01)
(Continued)

(52) U.S. Cl.
CPC ..... *H04B 10/50595* (2013.01); *H01S 5/0687* (2013.01); *H01S 5/06832* (2013.01); *H04B 10/50593* (2013.01)

(58) Field of Classification Search
CPC combination set(s) only.
See application file for complete search history.

(56) References Cited

U.S. PATENT DOCUMENTS 6,275,990 B1 * 8/2001 Dapper ................. H04H 60/96
375/E7.002

6,282,683 B1 * 8/2001 Dapper ................. H04L 5/1484
714/752

(Continued)

FOREIGN PATENT DOCUMENTS

CN     104954066 A     9/2015
CN     110535527 B     7/2020

OTHER PUBLICATIONS

C.R.S. Fludger et al.; "Low Cost Transmitter Self-Calibration of Time Delay and Frequency Response for High Baud-Rate QAM Transceivers"; OFC 2017@ OSA 2017; Cisco Optical GmbH, Nordostpark 12-14, 90411 Nürnberg, Germany (3 pages).

(Continued)

*Primary Examiner* — Agustin Bello
(74) *Attorney, Agent, or Firm* — Staas & Halsey LLP

(57) ABSTRACT

An apparatus at least includes a processor to, after a first signal passes through a narrowband photodetector, perform frequency mix of the first signal with a first reference signal and a second reference signal respectively and perform noise reduction, to obtain a first detection signal and a second detection signal. The first signal is obtained after a measurement signal passes through a filtering module of an optical transmitting end, the measurement signal being transmitted in a path of multiple branches, signals not transmitted in other paths of the multiple branches, a frame structure of the measurement signal including at least one two-tone signal, two tones in the two-tone signal having a fixed tone interval. The processor is to calculate group delays at multiple frequency bins according to the first detection signal and the second detection signal; and determine a phase response of the filtering module of the optical transmitting end in the path according to the group delays at multiple frequency bins.

18 Claims, 9 Drawing Sheets

(51) Int. Cl.
*H01S 5/0683* (2006.01)
*H01S 5/0687* (2006.01)

(56) References Cited

U.S. PATENT DOCUMENTS

| | | | | |
|---|---|---|---|---|
| 7,558,479 | B1* | 7/2009 | Robinson | H04B 10/2543 398/16 |
| 8,971,723 | B2* | 3/2015 | Le Taillandier De Gabory | H04L 25/14 398/208 |
| 9,438,350 | B1* | 9/2016 | Schmidt | H04B 10/50572 |
| 9,673,910 | B1* | 6/2017 | Crivelli | H04B 10/6161 |
| 10,038,498 | B1* | 7/2018 | Fan | H04B 10/532 |
| 10,333,616 | B1* | 6/2019 | Zinevich | H04L 1/203 |
| 10,965,439 | B2* | 3/2021 | Sun | H04B 10/6165 |
| 11,393,486 | B1* | 7/2022 | Woodruff | H04R 29/005 |
| 2006/0127102 | A1* | 6/2006 | Roberts | H04B 10/505 398/182 |
| 2012/0243648 | A1 | 9/2012 | Currivan et al. | |
| 2013/0259174 | A1* | 10/2013 | Qian | H04B 10/6165 375/346 |
| 2013/0329841 | A1* | 12/2013 | Keegan | H04B 17/364 375/350 |
| 2013/0336647 | A1* | 12/2013 | Le Taillandier De Gabory | H04B 10/0775 398/25 |
| 2014/0079098 | A1* | 3/2014 | Harjani | H04B 7/0837 375/219 |
| 2016/0211938 | A1* | 7/2016 | Jiang | H04B 10/516 |
| 2016/0240183 | A1* | 8/2016 | Noh | H03G 5/005 |
| 2017/0180055 | A1* | 6/2017 | Yu | H04J 14/06 |
| 2017/0187442 | A1* | 6/2017 | Luddy | H04B 7/0632 |
| 2017/0276398 | A1* | 9/2017 | Hanazono | G10K 11/17825 |
| 2018/0145761 | A1* | 5/2018 | Zhuge | H04B 10/077 |
| 2021/0336777 | A1* | 10/2021 | Brunner | H04L 9/0858 |
| 2022/0069861 | A1* | 3/2022 | Menkhoff | H04B 1/525 |
| 2022/0140912 | A1* | 5/2022 | Fan | H04B 10/50595 398/198 |

OTHER PUBLICATIONS

T. Tangmala et al.; "PD Frequency Response Measurement Technique Using MZM with Two-tone Lightwave Power Control"; 2013 Conference on Lasers and Electro-Optics Pacific Rim (CLEO-PR); 978-1-4673-6476-8/13 © 2013 IEEE (2 pages).

Antonio Napoli et al.; "Novel DAC digital pre-emphasis algorithm for next-generation flexible optical transponders"; Coriant R&D GmbH, St.-Martin-Str. 76, 81541, Munich, Germany; (3 pages).

Danish Rafique et al.; "Digital Pre-Emphasis in Optical Communication Systems: On the DAC Requirements for Terabit Transmission Applications"; German Federal Ministry of Education and Research; grant No. 01BP12300A; Jun. 2014 (10 pages).

Yangyang Fan et al.; "Overall Frequency Response Measurement of DSP-based Optical Transmitter Using Built-in Monitor Photodiode"; ECOC 2016; 42$^{nd}$ European Conference and Exhibition on Optical Communications; Sep. 18-22, 2016; Düsseldorf, Germany (3 pages).

\* cited by examiner ($\omega_{n-1}, \omega_n$)

PHASE RESPONSE MEASUREMENT METHOD AND APPARATUS

CROSS-REFERENCE TO RELATED APPLICATIONS

This application claims priority under 35 USC 119 to Chinese patent application no. 202011209286.6, filed on Nov. 3, 2020, in the China National Intellectual Property Administration, the entire contents of which are incorporated herein by reference.

TECHNICAL FIELD

This disclosure relates to the field of communication technologies.

BACKGROUND

In an optical communication system, a pre-equalization technique in a digital domain is often used to overcome a problem of limited bandwidth of an optical transmitter. Wherein, pre-equalization is used to compensate for filtering damages caused by various modules that a signal passes through in the optical transmitter. Cascaded filtering responses of these modules constitute a filter response of a transmission channel. Under the condition that the filtering response is known, a coefficient of a pre-equalizer may be obtained by various existing techniques, such as a zero forcing method, and a minimum mean square error method, etc.

It should be noted that the above description of the background is merely provided for clear and complete explanation of this disclosure and for easy understanding by those skilled in the art. And it should not be understood that the above technical solution is known to those skilled in the art as it is described in the background of this disclosure.

SUMMARY

In existing techniques, instruments may be used to measure a filtering response of a transmitter. However, the cost of measurement of the instruments is high and it is difficult to use on a large scale. The filtering response includes an amplitude-frequency response and a phase response, wherein the amplitude-frequency response may be measured by a narrowband photodetector (PD) built in an optical transceiver. There is no low-cost solution for measurement of the phase response. This disclosure proposes a phase response measurement method.

Addressed to at least one of the above problems, embodiments of this disclosure provide a phase response measurement method and apparatus.

According to a first aspect of the embodiments of this disclosure, there is provided a phase response measurement apparatus, wherein the apparatus includes: a first processing unit configured to, after a first signal passes through a narrowband photodetector, perform frequency mix of the first signal with a first reference signal and a second reference signal respectively and then perform noise reduction, to obtain a first detection signal and a second detection signal; wherein the first signal is obtained after a measurement signal passes through a filtering module of an optical transmitting end, the measurement signal being transmitted in a path of multiple branches, signals being not transmitted in other paths of the multiple branches, a frame structure of the measurement signal including at least one two-tone signal, two tones in the two-tone signal having a fixed tone interval; a first calculating unit configured to calculate group delays at multiple frequency bins according to the first detection signal and the second detection signal; and a first determining unit configured to determine a phase response of the filtering module of the optical transmitting end in the path according to the group delays at multiple frequency bins.

According to a second aspect of the embodiments of this disclosure, there is provided a phase response measurement method, wherein the method includes: transmitting a measurement signal in a path of multiple branches, and not transmitting a signal in other paths of the multiple branches, a frame structure of the measurement signal including at least one two-tone signal, two tones in the two-tone signal having a fixed tone interval; obtaining a first signal by passing the measurement signal through a filtering module of an optical transmitting end; after the first signal passes through a narrowband photodetector, performing frequency mixing of the first signal with a first reference signal and a second reference signal respectively and then performing noise reduction, to obtain a first detection signal and a second detection signal; calculating group delays at multiple frequency bins according to the first detection signal and the second detection signal; and determining a phase response of the filtering module of the optical transmitting end in the path according to the group delays at multiple frequency bins.

An advantage of the embodiments of this disclosure exists in that a phase response of a branch path is measured by using the single-path two-tone measurement signal and the built-in photodetector of the optical transceiver. Therefore, no additional measurement instrument is needed to measure the phase response, thereby avoiding the problems of high cost and difficulty of large-scale use brought about by the use of instruments to measure the phase response.

With reference to the following description and drawings, the particular embodiments of this disclosure are disclosed in detail, and the principle of this disclosure and the manners of use are indicated. It should be understood that the scope of the embodiments of this disclosure is not limited thereto. The embodiments of this disclosure contain many alternations, modifications and equivalents within the scope of the terms of the appended claims.

Features that are described and/or illustrated with respect to one embodiment may be used in the same way or in a similar way in one or more other embodiments and/or in combination with or instead of the features of the other embodiments.

BRIEF DESCRIPTION OF THE DRAWINGS

The drawings are included to provide further understanding of this disclosure, which constitute a part of the specification and illustrate the preferred embodiments of this disclosure, and are used for setting forth the principles of this disclosure together with the description. It is obvious that the accompanying drawings in the following description are some embodiments of this disclosure, and for those of ordinary skills in the art, other accompanying drawings may be obtained according to these accompanying drawings without making an inventive effort. In the drawings.

DETAILED DESCRIPTION

In the embodiments of this disclosure, terms "first", and "second", etc., are used to differentiate different elements with respect to names, and do not indicate spatial arrangement or temporal orders of these elements, and these elements should not be limited by these terms. Terms "and/or" include any one and all combinations of one or more relevantly listed terms. "contain", "include" and "have" refer to existence of stated features, elements, components, or assemblies, but do not exclude existence or addition of one or more other features, elements, components, or assemblies.

In the embodiments of this disclosure, single forms "a", and "the", etc., include plural forms, and should be understood as "a kind of" or "a type of" in a broad sense, but should not defined as a meaning of "one"; and the term "the" should be understood as including both a form and a plural form, except specified otherwise. Furthermore, the term "according to" should be understood as "at least partially according to", the term "based on" should be understood as least partially based on", except specified otherwise.

These and further aspects and features of this disclosure will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the terms of the appended claims.

Figure 1:
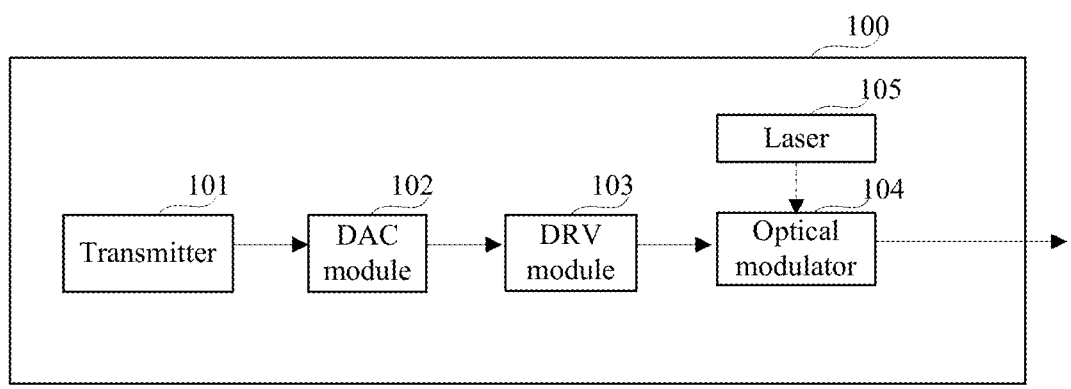
FIG. 1 is schematic diagram of a structure of an optical transmitting end of an embodiment of this disclosure.

FIG. 1 is schematic diagram of a structure of an optical transmitting end of an optical transmitter or optical transceiver of an embodiment of this disclosure. A structure 100 of the optical transmitter or optical transmitting end includes a transmitter 101, a digital-to-analog conversion module 102, a DRV module 103, an optical modulator 104, and a laser 105. Wherein, the transmitter 101 transmits a digital electrical signal, and then subsequent filtering modules, such as a digital-to-analog conversion (DAC) module 102, a drive (DRV) module 103, an optical modulator (such as a Mach-Zehnder modulator) 104, and a laser (LD) 105, bring about a filtering damage to the transmitted digital electrical signal after the digital electrical signal passes through these modules. Here, the filtering damage caused by the subsequent transmitting end filtering modules behind the transmitter 101, that is, the digital-to-analog conversion module 102, the DRV module 103, and the optical modulator 104, is referred to as a filtering response of the transmitting end. Embodiment of this disclosure proposes a method and apparatus for measuring a phase response in a filtering response.

Various implementations of the embodiments of this disclosure shall be described below with reference to the accompanying drawings. These implementations are illustrative only, and are not intended to limit the embodiments of this disclosure.

Embodiment of the First Aspect

This embodiment provides a phase response measurement method.

Figure 2:
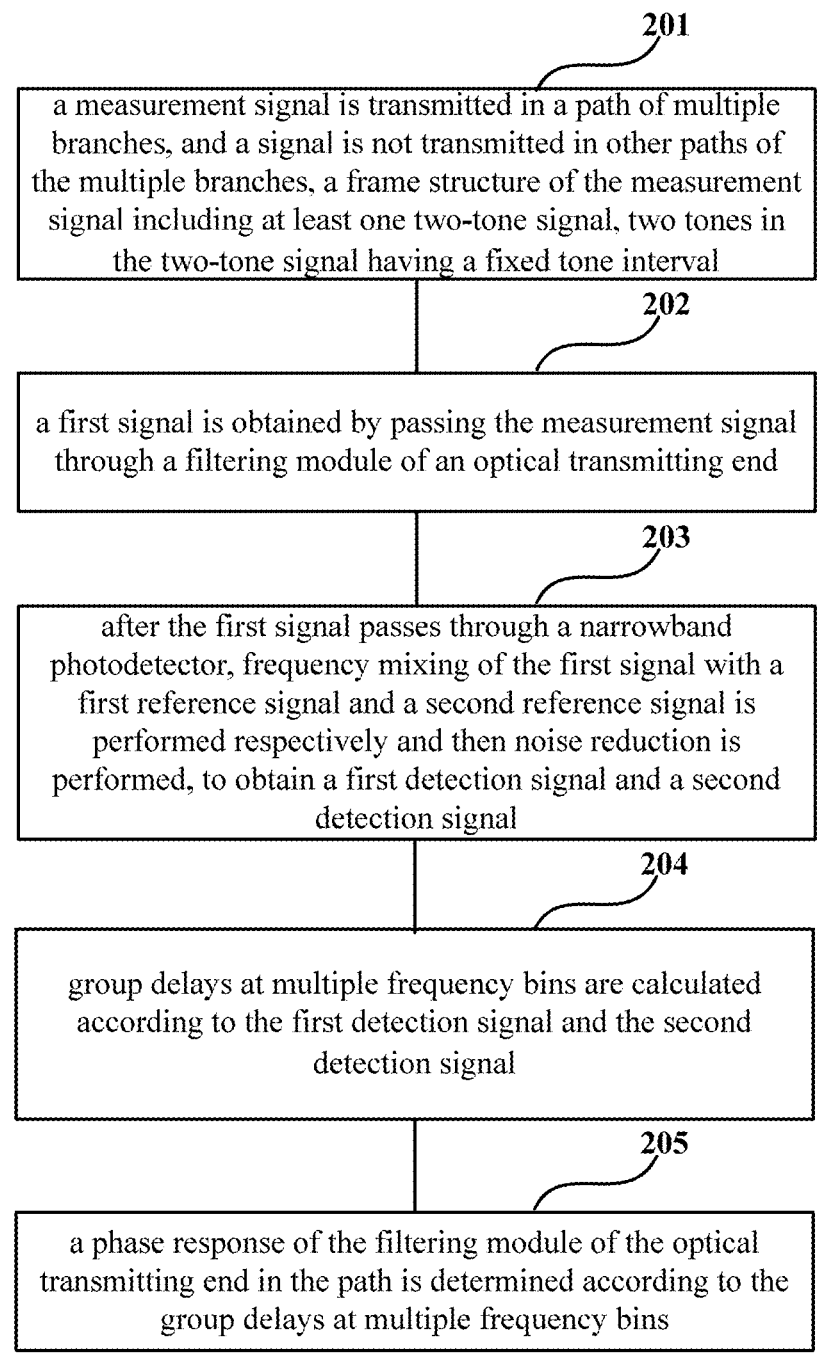
FIG. 2 is a schematic diagram of the phase response measurement method of an embodiment of this disclosure.

FIG. 2 is a schematic diagram of the phase response measurement method of the embodiment of this disclosure. The phase response measurement method includes:

201: a measurement signal is transmitted in a path of multiple branches, and a signal is not transmitted in other paths of the multiple branches, a frame structure of the measurement signal including at least one two-tone signal, two tones in the two-tone signal having a fixed tone interval;

202: a first signal is obtained by passing the measurement signal through a filtering module of an optical transmitting end;

203: after the first signal passes through a narrowband photodetector, frequency mixing of the first signal with a first reference signal and a second reference signal is performed respectively and then noise reduction is performed, to obtain a first detection signal and a second detection signal;

204: group delays at multiple frequency bins are calculated according to the first detection signal and the second detection signal; and 205: a phase response of the filtering module of the optical transmitting end in the path is determined according to the group delays at multiple frequency bins.

It can be seen from the above embodiment a phase response of a branch path is measured by using the single-path two-tone measurement signal and the built-in photodetector of the optical transceiver. Therefore, no additional measurement instrument is needed to measure the phase response, thereby avoiding the problems of high cost and difficulty of large-scale use brought about by the use of instruments to measure the phase response.

In some embodiments, the optical transmitting end filtering module may include: a digital-to-analog conversion (DAC) module and an optical modulator (such as a Mach-Zehnder modulator), and may also include a drive (DRV) module, an optical modulator (such as a Mach-Zehnder modulator), and a laser (LD), etc., and reference may be made to FIG. 1 for details. A filtering damage brought about by the optical transmitting end filtering module is referred to as a filter response of the transmitting end. The filter response $H(\omega)$ includes an amplitude-frequency response $A(\omega)$ and a phase response $\theta(\omega)$; where, $H(\omega)=A(\omega)\times\exp[j\theta(\omega)]$, and how to determine the phase response $\theta(\omega)$ shall be described below with reference to steps 201-205; where, $\omega$ denotes a frequency.

In some embodiments, the optical transmitting end may include multiple branch paths, such as an in-phase branch (I) path and a quadrature branch (Q) path; however, this disclosure is not limited thereto. For example, a dual-polarization modulation-based optical transmitting end may include four branch paths, namely an in-phase branch path in a horizontal polarization state, an orthogonal branch path in the horizontal polarization state, an in-phase branch path in a vertical polarization state, and an orthogonal branch path in the vertical polarization state, which shall not be enumerated herein any further. The phase response measurement method in the embodiment of this disclosure is directed to respective measurement the phase response of the optical transmitting end of each branch path. Wherein, phase response measurement method of each branch paths is identical. Following description shall be given by taking measurement of a phase response of an in-phase branch path in the horizontal polarization state as an example, and phase response measurement methods of other branch paths are similar thereto.

In some embodiments, in measuring a phase response of a path, a measurement signal is transmitted in this path only, and no signal is transmitted in other paths, that is, for other branch paths not to be measured (such as another branch path in the same polarization state with a branch path to be measured and an in-phase branch path and orthogonal branch path in another polarization state), the measurement signal being an all-zero signal.

Figure 3:
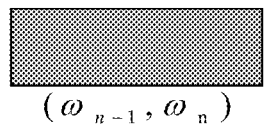
FIG. 3 is a schematic diagram of a frame structure of the measurement signal of the embodiment of this disclosure.

In some embodiments, a frame structure of the measurement signal transmitted by the path to be measured includes a two-tone signal. FIG. 3 is a schematic diagram of the frame structure of the measurement signal. As shown in FIG. 3, the frame structure includes a two-tone signal (a pair of frequencies, $\omega_n$ and $\omega_{n-1}$, n being an integer greater than or equal to 1), two frequencies in the two-tone signal having a fixed tone interval. For example, the measurement signal is expressed as $s_f(t)=\cos(\omega_n t)+\cos(\omega_{n-1} t)$; where, t denotes time; wherein the interval between two frequencies $\omega_n$ and $\omega_{n-1}$ is $\omega_n-\omega_{n-1}=d\omega$.

In some embodiments, the optical modulator in the filtering module of the optical transmitting end only sets a direct current bias of the path to be measured near a null point; however, there is no requirement on direct current bias and phase bias (bias P) of other branch paths. The direct current bias of other branch paths is set to be near the null point, or is set not to be near the null point, and the phase bias of other branch path is zero degree, or may not be zero degree, and this embodiment is not limited thereto.

In the measurement, the optical modulator is in a linear modulation state or in a nonlinear modulation state, and the embodiment of this disclosure is not limited thereto. For the sake of convenience of description, following description shall be given by taking the linear modulation as an example.

In some embodiments, when the optical modulator is in the linear modulation state, an equivalent baseband electric field component $u_1(t)$ of a first signal (corresponding to the frequency bin $\omega_n$) obtained after the measurement signal passes through the optical transmitting end filtering module is expressed as:

$$u_1(t) \propto A(\omega_n)\cos(\omega_n t+\theta(\omega_n))+A(\omega_{n-1})\cos(\omega_{n-1} t+\theta(\omega_{n-1})) \quad \text{formula 1}.$$

In some embodiments, after the first signal is photoelectrically converted by a narrow-band photodetector and low-pass filtered, high-order harmonic components of $\omega_n$ and $\omega_{n-1}$ will be filtered out, and the beat frequency $d\omega$ will be reserved, and a photocurrent $u_2(t)$ of an output end of the narrow-band photodetector is expressed as:

$$u_2(t) \propto A(\omega_n)A(\omega_{n-1})|G_{PD}(d\omega)|^*\cos[d\omega^*t+\theta(\omega_n)-\theta(\omega_{n-1})+\varphi_{PD}(d\omega)] \quad \text{formula 2};$$

where, $G_{PD}(d\omega)$ and $\varphi_{PD}(d\omega)$ are amplitude-frequency response and phase response of the narrow-band photodetector at $d\omega$.

Therefore, the photocurrent $u_2(t)$ of the output end of the narrow-band photodetector contains phase response information of the transmitting end.

In some embodiments, after the first signal passes through a narrowband photodetector, performing frequency mixing of the first signal with a first reference signal and a second reference signal respectively and then performing noise reduction, to obtain a first detection signal and a second detection signal; wherein the first reference signal and the second reference signal are $\cos(d\omega \times t+\delta)$ and $\sin(d\omega \times t+\delta)$, respectively, $d\omega$ is the tone interval, and $\delta$ is an initial phase of a reference signal relative to the measurement signal, which is a phase introduced for relative time delay between the reference signal and $u_2(t)$. In addition, an averaging operation $\langle \bullet \rangle$ is performed on a signal $u_2(t)\cos(d\omega \times t+\delta)$ obtained after the frequency mixing, and the averaging operation $\langle \bullet \rangle$ is performed on a signal $u_2(t)\sin(d\omega \times t+\delta)$ obtained after the frequency mixing, so as to filter out noises. The first detection signal and the second detection signal is expressed as:

$$I_n \propto A(\omega_n)A(\omega_{n-1})|G_{PD}(d\omega)|^*\cos[\theta(\omega_n)-\theta(\omega_{n-1})+(\varphi_{PD}(d\omega)-\delta] \quad \text{formula 3},$$

$$Q_n \propto -A(\omega_n)A(\omega_{n-1})|G_{PD}(d\omega)|^*\sin[\theta(\omega_n)-\theta(\omega_{n-1})+(\varphi_{PD}(d\omega)-\delta] \quad \text{formula 4}.$$

In some embodiments, the group delays at multiple frequency bins are calculated according to the first detection signal and the second detection signal; wherein a phase of the beat frequency is calculated according to the first detection signal and the second detection signal, and the group delays at the frequency bins are calculated according to the phase of the beat frequency. For example, an arctangent function $$a\tan\left(\frac{Q_n}{I_n}\right)$$

or a ratio or the first detection signal to the second detection signal is calculated to obtain the phase $\theta(\omega_n)-\theta(\omega_{n-1})+\varphi_{PD}(d\omega)-\delta$ of the beat frequency. Due to the group delay $$\tau(\omega_n)=-\frac{\theta(\omega_n)-\theta(\omega_{n-1})}{d\omega},$$

an estimated value of a group delay at frequency bin $\omega_n$ (i.e. a rate of change of a phase (phase shift) at frequency $\omega_n$ with respect to a frequency) is estimated as:

$$\hat{\tau}(\omega_n)=-\frac{a\tan\left(\frac{Q_n}{I_n}\right)}{d\omega}=\tau(\omega_n)-\frac{\varphi_{PD}(d\omega)-\delta}{d\omega}. \quad \text{formula 5}$$

In some embodiments, the two frequencies in the two-tone signal are changed to obtain the first signal corresponding to multiple frequency bins and the first detection signal and the second detection signal corresponding to the multiple frequency bins. The group delays at the multiple frequency bins are calculated according to the first detection signal and the second detection signal corresponding to the multiple frequency bins, and the group delays at the multiple frequency bins are integrated to determine the phase response of the optical transmitting end filtering module in the path.

In some embodiments, the transmitting end repeatedly transmits a frame containing the two-tone signal (frequencies $\omega_n$ and $\omega_{n-1}$), until the group delay at frequency bin $\omega_n$ is estimated. And the transmitting end changes the frequencies of the two-tone signal into $\omega_n$ and $\omega_{n+1}$, and repeatedly transmits a frame containing the changed two-tone signal (frequencies are $\omega_{n+1}$ and $\omega_n$), until the group delay at the frequency bin $\omega_{n+1}$ is obtained through estimation.

For example, the frequencies $\omega_n$ and $\omega_{n-1}$ of the two-tone signal are changed (such as by frequency sweeping) and a fixed tone interval $d\omega$ is maintained, such as changing the frequencies of the two-tone signal into $\omega_{n+1}$ and $\omega_n$ ($\omega_{n+1}-\omega_n=d\omega$), the first signal corresponding to the frequency bin $\omega_{n+1}$ is obtained according to formula 1), the first detection signal and the second detection signal corresponding to frequency bin $\omega_{n+1}$ are obtained according to formulae 2)-4), and the group delay $\hat{\tau}(\omega_{n+1})$ at the frequency bin $\omega_{n+1}$ is obtained according to formula 5), and so on. In the same manner, group delays $\hat{\tau}(\omega_{n+2})$, $\hat{\tau}(\omega_{n+3})$, $\hat{\tau}(\omega_{n+4})$ ... at frequency bins $\omega_{n+2}$, $\omega_{n+3}$, $\omega_{n+4}$ ..., are obtained, the group delays at the above multiple frequency bins are integrated, and a phase response $\hat{\theta}(\omega_n)$ is obtained through estimation:

$$\hat{\theta}(\omega_n)=\theta(\omega_n)-\theta(\omega_0)+n[\varphi_{PD}(d\omega)-\delta] \quad \text{formula 6).}$$

In some embodiments, the phase response $\theta(\omega_0)$ of the path to be measured at a certain low frequency $\omega_0$ is a constant, and a form of the phase response is not changed; in addition, a component $n[\varphi_{PD}(d\omega)-\delta]$ caused by a group delay error introduces an inclination angle into the estimated phase response $\hat{\theta}(\omega)$. However, in calculating a pre-equalization coefficient according to the jointly measured phase response $\hat{\theta}(\omega_n)$ and amplitude-frequency response, the inclination angle only increases a time delay of an equalized output signal, and does not change a waveform of the signal, hence, a pre-equalization effect of the branch path will not be affected. In other words, although the phase response obtained by using formula 6) includes an error component, in determining the pre-equalization coefficient according to the phase response, the error component does not affect the effect of the pre-equalization, and thus does not affect compensation processing of filtering characteristics.

In some embodiments, after the phase responses of each branch path of the optical transmitting end are determined in the above manner, the pre-equalization coefficient is calculated according to the phase responses, and pre-equalization processing is performed on the transmitted signal according to the pre-equalization coefficient, there will be relative time delays between different branch paths, and the relative time delays is measured according to the relevant art, and the embodiment of this disclosure is not limited thereto. And the measured relative time delays is applied to an input signal of the DAC to perform compensation for the relative time delays. Reference may be made to the embodiment of the seventh aspect described later for a particular flow.

It can be seen from the above embodiment that a phase response of a branch path is measured by using the single-path two-tone measurement signal and the built-in photodetector of the optical transceiver. Therefore, no additional measurement instrument is needed to measure the phase response, thereby avoiding the problems of high cost and difficulty of large-scale use brought about by the use of instruments to measure the phase response.

Embodiment of the Second Aspect

This embodiment provides a phase response measurement method. What is different from the embodiment of the first aspect is that each frame structure of the measurement signal includes at least two two-tone signals, rather than one two-tone signal. In addition, a group delay obtained for each frame containing the measurement signal is not a group delay at one frequency bin, but is a group delay segment. The differences from the embodiment of the first aspect shall be described in detail below, with identical parts being not going to be described herein any further.

Figure 4A:
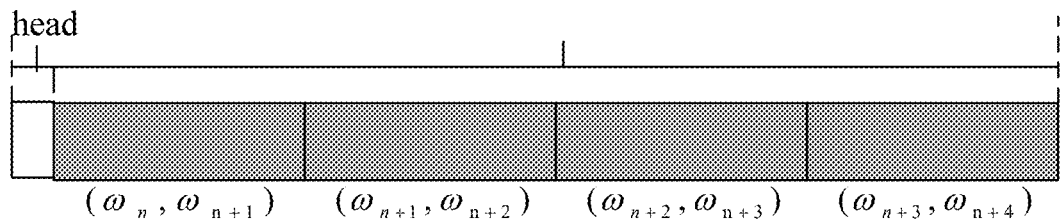
FIGS. 4A-4C are schematic diagrams of frame structures of the measurement signals of the embodiment of this disclosure.

In some embodiments, the frame structure of the measurement signal includes at least two (N, N being greater than or equal to 2) two-tone signals, tone intervals between the two frequencies in each two-tone signal being identical. For example, a low frequency in each two-tone signal is increased progressively by a second tone interval. The second tone is equal to the tone interval $d\omega$; however, this embodiment is not limited thereto. FIG. 4A is a schematic diagram of the frame structure of the measurement signal of this embodiment. As shown in FIG. 4A. the frame structure of the measurement signal includes N=4 two-tone signals, tone intervals between the two-tone signals being all equal to $d\omega$, that is, $\omega_{n+1}-\omega_n=\omega_{n+2}-\omega_{n+1}=\omega_{n+3}-\omega_{n+2}=\omega_{n+4}-\omega_{n+3}=d\omega$, and low-frequencies $\omega_n$, $\omega_{n+1}$, $\omega_{n+2}$, $\omega_{n+3}$ increasing progressively by the tone interval $d\omega$. Optionally, the frame structure of the measurement signal may also include a frame head (the head in the figure), the frame head being an all-zero signal. However, this disclosure is not limited thereto, and the frame head is used for frame synchronization to locate time positions of the two-tone signals.

In some embodiments, it can be seen from the embodiment of the first aspect that the two-tone signals is used to measure the group delays at a frequency bin. Hence, the N two-tone signals of the measurement signals in this embodiment is measured to obtain group delays at N frequency bins. The group delays at N frequency bins are hereinafter referred to in brief as a group delay segment (such as an n-th group delay segment, corresponding to measurement signals $(\omega_n, \omega_{n+1})$, $(\omega_{n+1}, \omega_{n+2})$, $(\omega_{n+2}, \omega_{n+3})$, $(\omega_{n+3}, \omega_{n+4})$).

Figure 5:
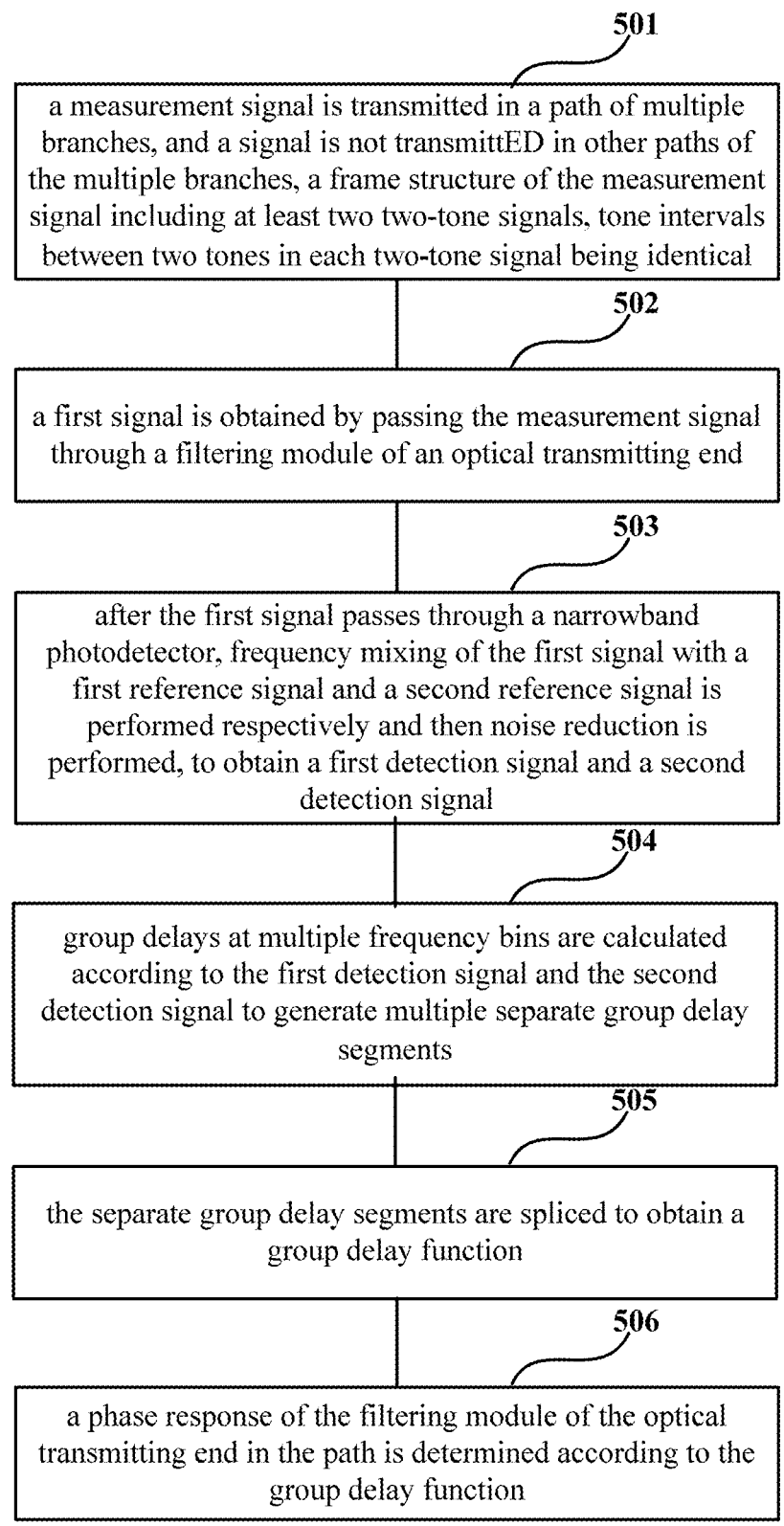
FIG. 5 is a schematic diagram of the phase response measurement method of an embodiment of this disclosure.

FIG. 5 is a schematic diagram of the phase response measurement method in the embodiment of this disclosure. As shown in FIG. 5, the method includes:

501: a measurement signal is transmitted in a path of multiple branches, and a signal is not transmitted in other paths of the multiple branches, a frame structure of the measurement signal including at least two two-tone signals, details of the frame structure being as described above, which shall not be described herein any further;

502: a first signal is obtained by passing the measurement signal through a filtering module of an optical transmitting end;

503: after the first signal passes through a narrowband photodetector, frequency mixing of the first signal with a first reference signal and a second reference signal is performed respectively and then noise reduction is performed, to obtain a first detection signal and a second detection signal;

504: group delays at multiple frequency bins are calculated according to the first detection signal and the second detection signal to generate multiple separate group delay segments;

505: the separate group delay segments are spliced to obtain a group delay function; and

506: a phase response of the filtering module of the optical transmitting end in the path is determined according to the group delay function.

In some embodiments, reference may be made to 201-202 in the embodiment of the first aspect for implementations of 501-502, with a difference being that the measurement signal in 501 includes at least two two-tone signals, rather than one two-tone signal.

How to obtain a group delay segment shall be first described below.

In some embodiments, in 503, the first signal needs to be synchronized after passing through the narrowband photodetector PD, wherein the transmitting end repeatedly transmits a frame of a measurement signal containing at least two two-tone signals (as shown in FIG. 4A), and the PD may receive a measurement signal with multiple (M) repeated frames, and use a frame head to synchronize the signal received by the PD, and then perform frequency mixing and noise reduction of the first signal with the first reference signal and the second reference signal respectively, to obtain the first detection signal and the second detection signal. Reference may be made to the embodiment of the first aspect for a particular process of frequency mixing and noise reduction, which shall not be described herein any further. In 504, the phase of the beat frequency is calculated according to the first detection signal and the second detection signal, and reference may be made to the embodiment of the first aspect for a particular calculation method, which shall not be described herein any further. The phase of the beat frequency is expressed as $\phi_{p,m}$; where, p denotes an p-th frequency bin in an n-th group delay segment, p=1, 2, ..., N, and m denotes an m-th frame signal, m=1, 2, ..., M. And the n-th group delay segment is determined according to each $\phi_{p,m}$.

Figure 6:
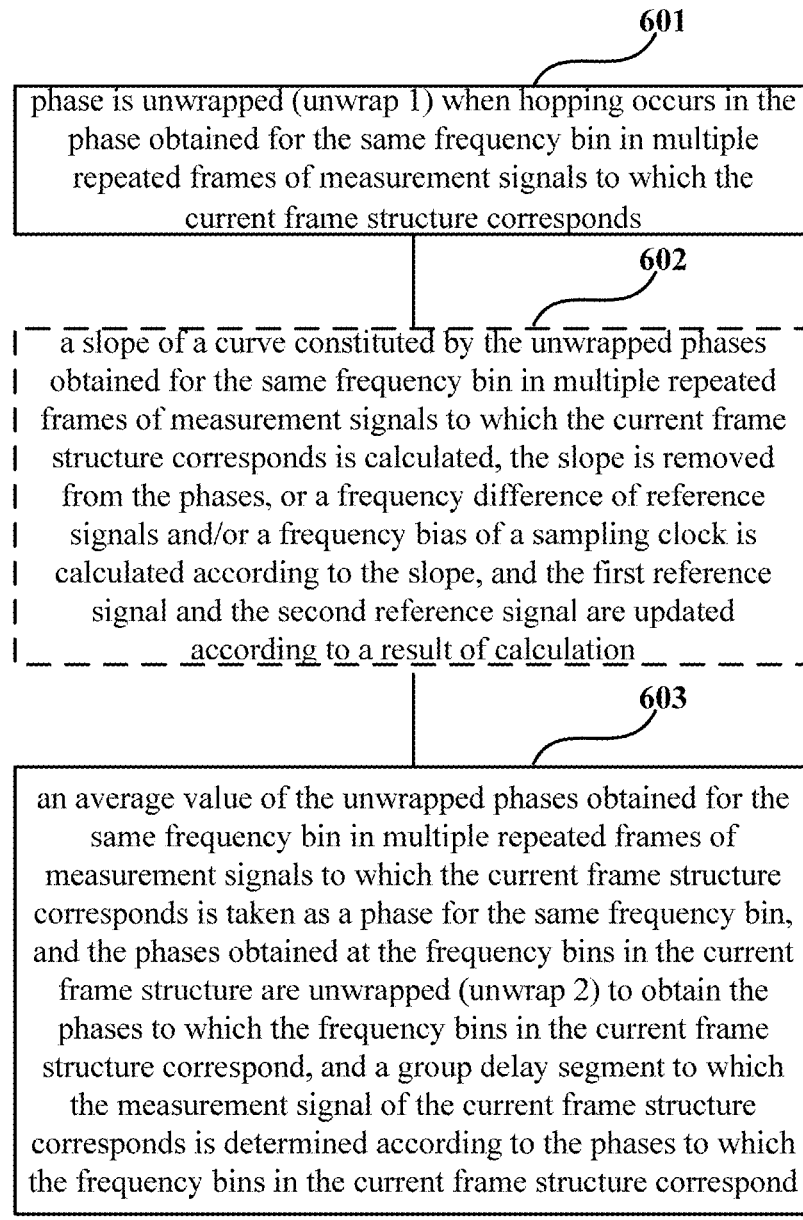
FIG. 6 is a schematic diagram of a method for determining a group delay segment according to a phase of a beat frequency of an embodiment of this disclosure.

FIG. 6 is a schematic diagram of a method for determining the n-th group delay segment according to the phase of the beat frequency in this embodiment. As shown in FIG. 6, the method includes:

601: phase is unwrapped (unwrap 1) when hopping occurs in the phase obtained for the same frequency bin in multiple repeated frames of measurement signals to which the current frame structure corresponds; and

603: an average value of the unwrapped phases obtained for the same frequency bin in multiple repeated frames of measurement signals to which the current frame structure corresponds is taken as a phase for the same frequency bin, and the phases obtained at the frequency bins in the current frame structure are unwrapped (unwrap 2) to obtain the phases to which the frequency bins in the current frame structure correspond, and a group delay segment to which the measurement signal of the current frame structure corresponds is determined according to the phases to which the frequency bins in the current frame structure correspond.

In some embodiments, in 601, for the same frequency bin, the phases $\phi_{p,1}, \phi_{p,2}, \ldots, \phi_{p,M}$ estimated from the M (M is greater than or equal to 2) repeated frames should have identical theoretical values. In order to avoid phase hopping (phase wrapping) caused by noises, $\phi_{p,1}, \phi_{p,2}, \ldots, \phi_{p,M}$ is unwrapped so that $|\phi_{p,i} - \phi_{p,i-1}| < \pi (i=2, 3, \ldots, M)$, that is, phase hopping is made not to occur at $\pi$, thereby reflecting a true phase change.

In some embodiments, phases of beat frequencies for the same frequency bin p in the M frames are averaged, and the average value is taken as the phase $\phi_p$ of the beat frequency of the frequency bin p, and averaging is performed for the frequency bins sequentially, and phases $\phi_p$ (p=1, 2, ..., N) of the beat frequencies of each frequency bin in the n-th group delay segment is obtained. As a difference between phases of beat frequencies of two adjacent frequency bins is usually within $\pi$, N phases are unwrapped to ensure $|\phi_p - \phi_{p-1}| < \pi$. According to the phases $\phi_p$ (p=1, 2, ..., N) to which the frequency bins correspond, the group delay segment $$\hat{\tau}(\omega_p) = -\frac{\phi_p}{d\omega}$$

to which the measurement signal of the current frame structure corresponds is determined.

In some embodiments, after the unwrap 1, the method may further include (optional):

602: a slope of a curve constituted by the unwrapped phases obtained for the same frequency bin in multiple repeated frames of measurement signals to which the current frame structure corresponds is calculated, the slope is removed from the phases, or a frequency difference of reference signals and/or a frequency bias of a sampling clock is calculated according to the slope, and the first reference signal and the second reference signal are updated according to a result of calculation.

In some embodiments, when the two-tone measurement is a high-frequency signal, the reference signals are low-frequency signals, and a frequency difference therebetween is very large. If their signal clocks run independently, the curve formed by the phases $\phi_{p,1}, \phi_{p,2}, \ldots, \phi_{p,M}$ after unwrap 1 may have a slope. In a case where the slope exists, unwrap 2 is performed after removing the slope in this method. For example, the slope is directly removed from the phase; or a frequency offset of the reference signal and/or a frequency bias of the sampling clock is/are calculated according to the slope, a calculation result, such as $F_{offset}$, is fed back, and the first reference signal $\cos(d\omega \times t + \delta)$ and the second reference signal $\sin(d\omega \times t + \delta)$ are updated according to the fed back calculation result.

Figure 4B:
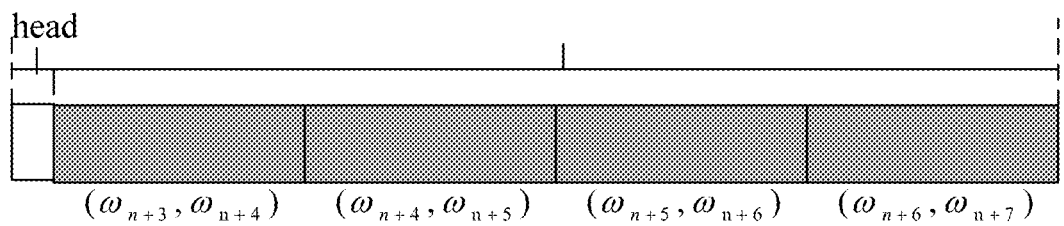
Figure 4C:
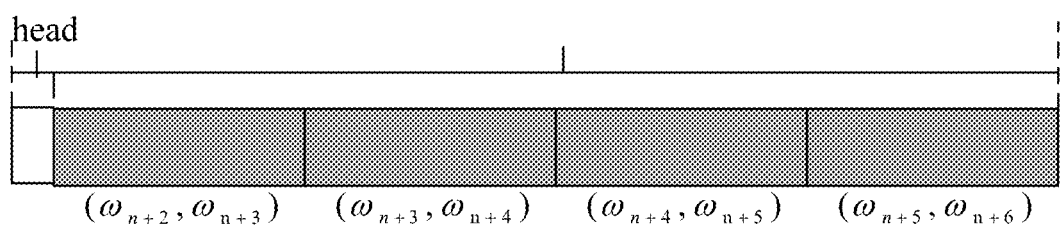

How to determine a group delay segment (such as the n-th group delay segment) is described above. In some embodiments, two frequencies in each of the two-tone signals in the measurement signal of the current frame structure are changed to obtain separate group delay segments to which measurement signals of different frame structures correspond; wherein lowest tones of the two measurement signals used for measuring adjacent group delay segments are different; and wherein the two measurement signals used for measuring the adjacent group delay segments include at least one (K, K being greater than or equal to 1) same overlapped two-tone signals; for example, when two frequencies in each of the two-tone signals in the measurement signal of the current frame structure are changed, K consecutive two-tone signals of latter two-tone signals of the measurement signal before being changed and former two-tone signals of the measurement signal after being changed are made consistent, or K consecutive two-tone signals of latter two-tone signals of the measurement signal after being changed and former two-tone signals of the measurement signal before being changed are made consistent, where, N>K≥1; wherein the measurement signals with K overlapped two-tone signals before and after being changed may obtain adjacent group delay segments through measurement. FIGS. 4B and 4C show schematic diagrams of the measurement signal after being changed when K=1 and K=2, respectively. As shown in FIG. 4B, the measurement signal used to obtain an (n+1)-th group delay segment has 4 two-tone signals, frequencies of the two-tone signals being ($\omega_{n+3}$, $\omega_{n+4}$), ($\omega_{n+4}$, $\omega_{n+5}$), ($\omega_{n+5}$, $\omega_{n+6}$) and ($\omega_{n+6}$, $\omega_{n+7}$), respectively, and has one overlapping two-tone signal ($\omega_{n+3}$, $\omega_{n+4}$) in comparison with the measurement signal before being changed in FIG. 4A. As shown in FIG. 4C, the measurement signal used to obtain the (n+1)-th group delay segment has 4 two-tone signals, frequencies of the two-tone signals being ($\omega_{n+2}$, $\omega_{n+3}$), ($\omega_{n+3}$, $\omega_{n+4}$), ($\omega_{n+4}$, $\omega_{n+5}$) and ($\omega_{n+5}$, $\omega_{n+6}$), respectively, and has two overlapping two-tone signals, ($\omega_{n+2}$, $\omega_{n+3}$) and ($\omega_{n+3}$, $\omega_{n+4}$), in comparison with the measurement signal before being changed in FIG. 4A. After obtaining the n-th group delay segment, the transmitting end repeatedly transmits a frame of a measurement signal containing at least two two-tone signals (as shown in FIG. 4B or 4C), and the PD may receive a measurement signal with multiple (M) repeated frames, and use a frame head to synchronize the signals received by the PD, and then perform frequency mixing and noise reduction with the first reference signal and the second reference signal respectively, calculate the phase of the beat frequency according to the first detection signal and the second detection signal, and determine the (n+1)-th group delay segment. A particular procedure is identical to the manner of determining the n-th group delay segment described above, and shall not be described herein any further.

In some embodiments, in 505, the separate group delay segments are spliced according to the group delays at overlapped frequency bins obtained by measurement of the overlapped two-tone signals. For example, an average value of a difference between group delays at all or part (all K or at least one of K) of the overlapped frequency bins of two neighboring group delay segments is calculated, and group delays at frequency bins on one of the two neighboring group delay segments are changed according to the average value so that the two neighboring group delay segments are connected end to end. For example, differences between group delays at frequency bins on a segment and the average value are respectively calculated, and the differences are taken as the group delays at the frequency bins on the segment after being spliced; or an average value of group delays at overlapped frequency bins of two neighboring group delay segments is taken as the group delay of the overlapped frequency bins after being spliced, and group delays at frequency bins on the two neighboring group delay segments are changed according to the average value so that the two neighboring group delay segments are connected end to end. For example, calculating a first difference between the group delay at the overlapped frequency bin on a segment before being spliced and the average value, and calculating second differences between the group delays at the frequency bins on the segment and the first difference, and values of the second differences are taken as the group delays at the frequency bins on the segment after being spliced. Hence, a complete group delay segment is obtained, and the phase response of the path is obtained by integrating the complete group delay segment.

It can be seen from the above embodiment that a phase response of a branch path is measured by using the single-path two-tone measurement signal and the built-in photodetector of the optical transceiver. Therefore, no additional measurement instrument is needed to measure the phase response, thereby avoiding the problems of high cost and difficulty of large-scale use brought about by the use of instruments to measure the phase response.

In addition, in a process of measuring group delays of different frequency bins, an initial phase $\delta_n$ of the reference signals relative to the measurement signal may change randomly, introducing random group delay error $\delta_n/d\omega$ into estimated values of the group delays of different frequency bins. Such a random error will change a $\hat{\tau}(\omega)$ shape of the group delay curve. If an accordingly-obtained phase response is used to calculate the pre-equalization coefficient, a pre-equalization performance will be affected. It can be seen from the above embodiment that the group delays corresponding to the overlapped frequency bins are used to splice the separate group delay segments, and the random group delay error caused by the change of the phase difference between the reference signal and the measurement signal is eliminated.

Embodiment of the Third Aspect

This embodiment provides a phase response measurement apparatus, provided at an optical transmitter or a transmitting end of an optical transceiver of the optical communication system. As a principle of the apparatus for solving problems is similar to that of the method in the first or second aspect, reference may be made to the implementation of the method in the first or second aspect for implementation of this apparatus, with identical contents being going to be described herein any further.

Figure 7:
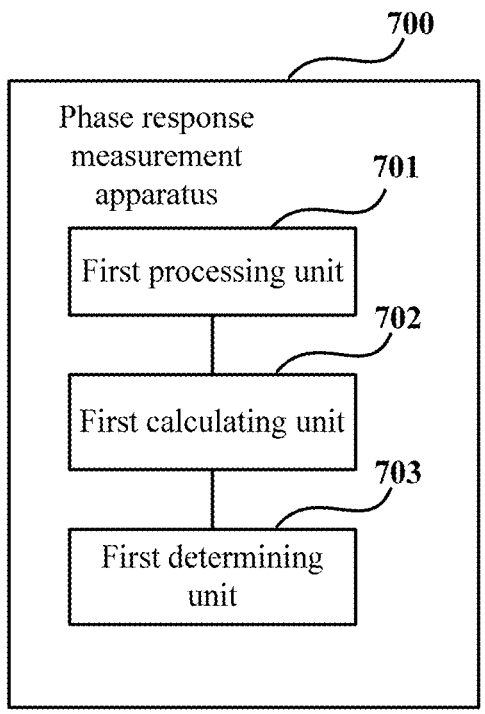
FIG. 7 is a schematic diagram of the phase response measurement apparatus of an embodiment of this disclosure.

FIG. 7 is a schematic diagram of the phase response measurement apparatus of the embodiment. As shown in FIG. 7, a phase response measurement apparatus 700 includes:

a first processing unit 701 configured to, after a first signal passes through a narrowband photodetector, perform frequency mix of the first signal with a first reference signal and a second reference signal respectively and then perform noise reduction, to obtain a first detection signal and a second detection signal; wherein the first signal is obtained after a measurement signal passes through a filtering module of an optical transmitting end, the measurement signal being transmitted in a path of multiple branches, signals being not transmitted in other paths of the multiple branches, a frame structure of the measurement signal including at least one two-tone signal, two tones in the two-tone signal having a fixed tone interval;

a first calculating unit 702 configured to calculate group delays at multiple frequency bins according to the first detection signal and the second detection signal; and a first determining unit 703 configured to determine a phase response of the filtering module of the optical transmitting end in the path according to the group delays at multiple frequency bins.

In some embodiments, reference may be made to steps 201-205 in the embodiment of the first aspect for implementations of the first processing unit 701, the first calculating unit 702 and the first determining unit 703, which shall not be described herein any further.

In some embodiments, the first reference signal and the second reference signal are $\cos(d\omega \times t + \delta)$ and $\sin(d\omega \times t + \delta)$, respectively; where, $d\omega$ is the tone interval, and $\delta$ is an initial phase of the first reference signal and/or the second reference signal relative to the measurement signal.

In some embodiments, the apparatus further includes (optional, not shown):

a first controlling unit configured to change the two tones in the two-tone signal so that the first processing unit 702 obtains a first detection signal and a second detection signal corresponding to multiple frequency bins; the first calculating unit 702 calculates a phase of a beat frequency according to the first detection signal and the second detection signal corresponding to multiple frequency bins, and determines the group delays at multiple frequency bins according to the phase of the beat frequency, and the first determining unit 703 performs integration on the group delays at multiple frequency bins to determine the phase response of the filtering module of the optical transmitting end in the path.

In some embodiments, an optical modulator in the filtering module of the optical transmitting end only sets DC bias of the path to be near a null point.

Figure 8:
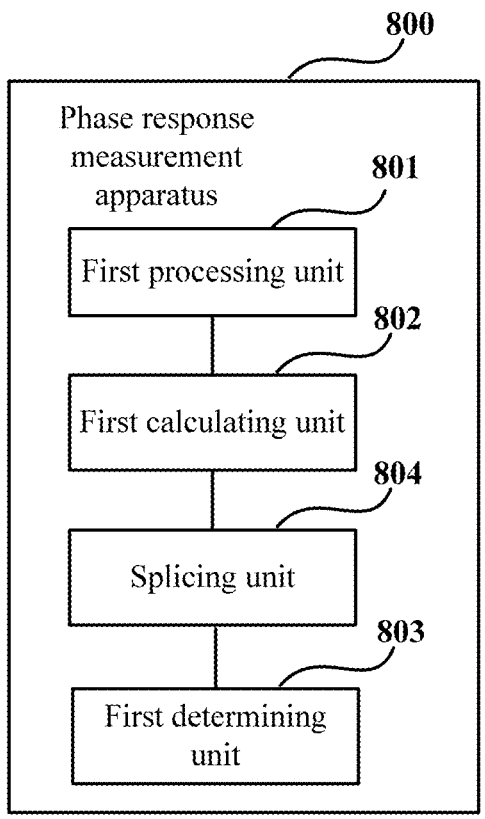
FIG. 8 is a schematic diagram of the phase response measurement apparatus of an embodiment of this disclosure.

FIG. 8 is a schematic diagram of a structure of the phase response measurement apparatus of this embodiment. As shown in FIG. 8, a phase response measurement apparatus 800 includes:

a first processing unit 801 configured to, after a first signal passes through a narrowband photodetector, perform frequency mix of the first signal with a first reference signal and a second reference signal respectively and then perform noise reduction, to obtain a first detection signal and a second detection signal; wherein the first signal is obtained after a measurement signal passes through a filtering module of an optical transmitting end, the measurement signal being transmitted in a path of multiple branches, signals being not transmitted in other paths of the multiple branches, a frame structure of the measurement signal including at least two (N) two-tone signals, tone intervals between two tones in each two-tone signal being the same, and two tones in the two-tone signals having a fixed tone interval;

a first calculating unit 802 configured to calculate group delays at multiple frequency bins according to the first detection signal and the second detection signal; and a first determining unit 803 configured to determine a phase response of the filtering module of the optical transmitting end in the path according to the group delays at multiple frequency bins.

In some embodiments, the first calculating unit 802 calculates group delays at multiple (N) frequency bins to which a measurement signal of a current frame structure corresponds, the group delays at multiple frequency bins constituting a group delay segment corresponding to the current frame structure, and the apparatus further includes:

a second controlling unit (optional, not shown) configured to change two tones in each two-tone signal in the measurement signal of the current frame structure so that the first calculating unit 802 calculates separate group delay segments to which measurement signals of different frame structures correspond; wherein lowest tones of two measurement signals used for measuring neighboring group delay segments are different; and a splicing unit 804 configured to splice the separate group delay segments according to group delays at overlapped frequency bins obtained by measurement of overlapped two-tone signals; wherein two measurement signals used for measuring neighboring group delay segments containing at least one same overlapped two-tone signal;

and the first determining unit 803 determines the phase response of the filtering module of the optical transmitting end in the path according to the spliced group delay segments.

In some embodiments, the splicing unit 804 calculates an average value of a difference between group delays at all or part of the overlapped frequency bins of two neighboring group delay segments, and changes group delays at frequency bins on one of the two neighboring group delay segments according to the average value so that the two neighboring group delay segments are connected end to end, or takes an average value of group delays at overlapped frequency bins of two neighboring group delay segments as spliced group delays of the overlapped frequency bins, and changes group delays at frequency bins on the two neighboring group delay segments according to the average value so that the two neighboring group delay segments are connected end to end.

In some embodiments, reference may be made to steps 501-506 in the embodiment of the second aspect for implementations of the first processing unit 801, the first calculating unit 802, the first determining unit 803 and the splicing unit 804, which shall not be described herein any further.

Figure 9:
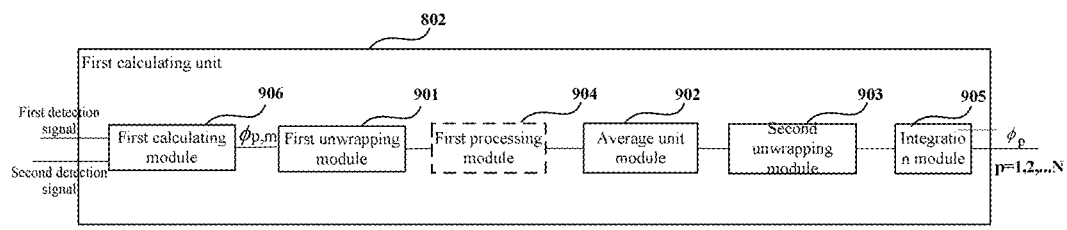
FIG. 9 is a schematic diagram of a structure of a first calculating unit of an embodiment of this disclosure.

In some embodiments, FIG. 9 is a schematic diagram of a structure of the first calculating unit 802. As shown in FIG. 9, the first calculating unit 802 at least includes:

a first calculating module 906 configured to calculate according to the first detection signal and the second detection signal to obtain phases of beat frequencies of different two-tone signals in the current frame structure;

a first unwrapping module 901 configured to unwrap the phases when hopping occurs in the phases obtained for the same frequency bin in frames of multiple repeated measurement signals to which the current frame structure corresponds;

an average unit module 902 configured to calculate an average value of the unwrapped phases obtained for the same frequency bin in frames of multiple repeated measurement signals to which the current frame structure corresponds, and take the average value as a phase for the same frequency bin;

a second unwrapping module 903 configured to unwrap the phases obtained at the frequency bins in the current frame structure to obtain the phases to which the frequency bins in the current frame structure correspond; and an integration module 905 configured to determine a group delay segment to which the measurement signal of the current frame structure corresponds according to the phases to which the frequency bins in the current frame structure correspond.

In some embodiments, the first calculating unit 802 may further include (optional, not shown):

a first processing module 904 configured to calculate a slope of a curve constituted by the unwrapped phases obtained for the same frequency bin in frames of multiple repeated measurement signals to which the current frame structure corresponds, and remove the slope from the phases, or calculate a frequency difference of reference signals and/or a frequency bias of a sampling clock according to the slope, and update the first reference signal and the second reference signal according to a result of calculation.

In some embodiments, reference may be made to steps 601-603 in the embodiment of the second aspect for implementations of the first unwrapping module 901, the average unit module 902, the second unwrapping module 903, the first processing module 904 and the integration module 905, with repeated parts being not be described herein any further.

In some embodiments, optionally, in using the transmitter or the transmitter and filtering module of the transceiver or the transceiver, the apparatus 800 may further include a setting unit (not shown) configured to set the pre-equalizer of the transmitter or the transceiver, so that the pre-equalizer does not work. However, it is not limited to the above embodiment, and the setting unit may also be provided at the transmitter, or a receiver, or the transceiver.

In some embodiments, the measurement signal is transmitted by a communication device with a phase response of a transmitting end to be measured, such as a transmitter or a transmitter of a transceiver, and the measurement signal passes through the transmitting end filtering module of the communication device with a transmitting end filtering characteristic to be measured, and then the apparatus 700 or 800 determines the phase response according to the acquired first signal.

In some embodiments, the apparatus 700 or 800 may further include a narrowband photodetector. Optionally, the narrowband photodetector may also be provided in the above communication device, and the apparatus 700 or 800 determines the phase response according to an output signal obtained after the first signal passes through the narrowband photodetector.

It can be seen from the above embodiment that a phase response of a branch path is measured by using the single-path two-tone measurement signal and the built-in photodetector of the optical transceiver. Therefore, no additional measurement instrument is needed to measure the phase response, thereby avoiding the problems of high cost and difficulty of large-scale use brought about by the use of instruments to measure the phase response.

In addition, in a process of measuring group delays of different frequency bins, an initial phase $\delta_n$ of the reference signals relative to the measurement signal may change randomly, introducing random group delay error $\delta_n/d\omega$ into estimated values of the group delays of different frequency bins. Such a random error will change a $\hat{\tau}(\omega)$ shape of the group delay curve. If an accordingly-obtained phase response is used to calculate the pre-equalization coefficient, a pre-equalization performance will be affected. It can be seen from the above embodiment that the group delays corresponding to the overlapped frequency bins are used to splice the separate group delay segments, and the random group delay error caused by the change of the phase difference between the reference signal and the measurement signal is eliminated.

Embodiment of the Fourth Aspect

This embodiment provides a communication system, including the phase response measurement apparatus 700 or 800 described in the embodiment of the third aspect, and a communication device, which is a transmitter or a transceiver.

Figure 10:
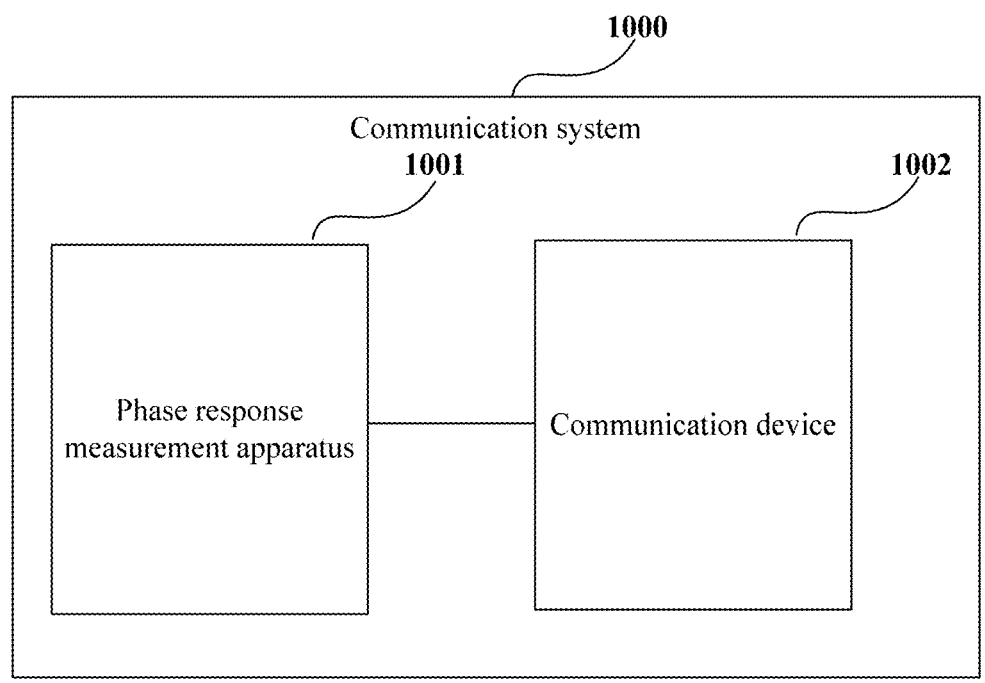
FIG. 10 is a schematic diagram of a structure of the communication system of an embodiment of this disclosure.

FIG. 10 is a schematic diagram of the structure of the communication system of this embodiment. As shown in FIG. 10, a communication system 1000 includes a phase response measurement apparatus 1001 configured to measure a phase response of a transmitting end, and reference is made to the phase response measurement apparatus 700 or 800 in the embodiment of the third aspect for implementation of the phase response measurement apparatus 1001. The communication system may further include a communication device 1002, which at least includes the modules shown in FIG. 1, and reference may be to FIG. 1 for structures thereof, which shall not be described herein any further. Furthermore, the communication device may include a photodetector (provided after a modulator) and a pre-equalizer (provided after the transmitter), etc. For example, when the communication device is a transceiver, the communication device may also include a receiving end module, such as a demodulator, and an analog-to-digital conversion module, etc., and reference may be made to the relevant art for details, which shall not be enumerated herein any further.

In some embodiments, in measuring a phase response of the transmitting end, the pre-equalizer of the communication device 1002 is first stopped, and then the transmitter of the communication device 1002 transmits a measurement signal of different frequencies, the measurement signal passes through a transmitting end filtering module to obtain a first signal, the first signal is transmitted to the phase response measurement apparatus 1001 after passing through the PD, and the apparatus 1001 measures the phase response of the transmitting end.

It can be seen from the above embodiment that a phase response of a branch path is measured by using the single-path two-tone measurement signal and the built-in photodetector of the optical transceiver. Therefore, no additional measurement instrument is needed to measure the phase response, thereby avoiding the problems of high cost and difficulty of large-scale use brought about by the use of instruments to measure the phase response.

Embodiment of the Fifth Aspect

This embodiment provides a communication device. What is different from the embodiment of the fourth aspect is that in this embodiment, functions of a phase response measurement apparatus are integrated into the communication device, the communication device being a transmitter or a transceiver.

Figure 11:
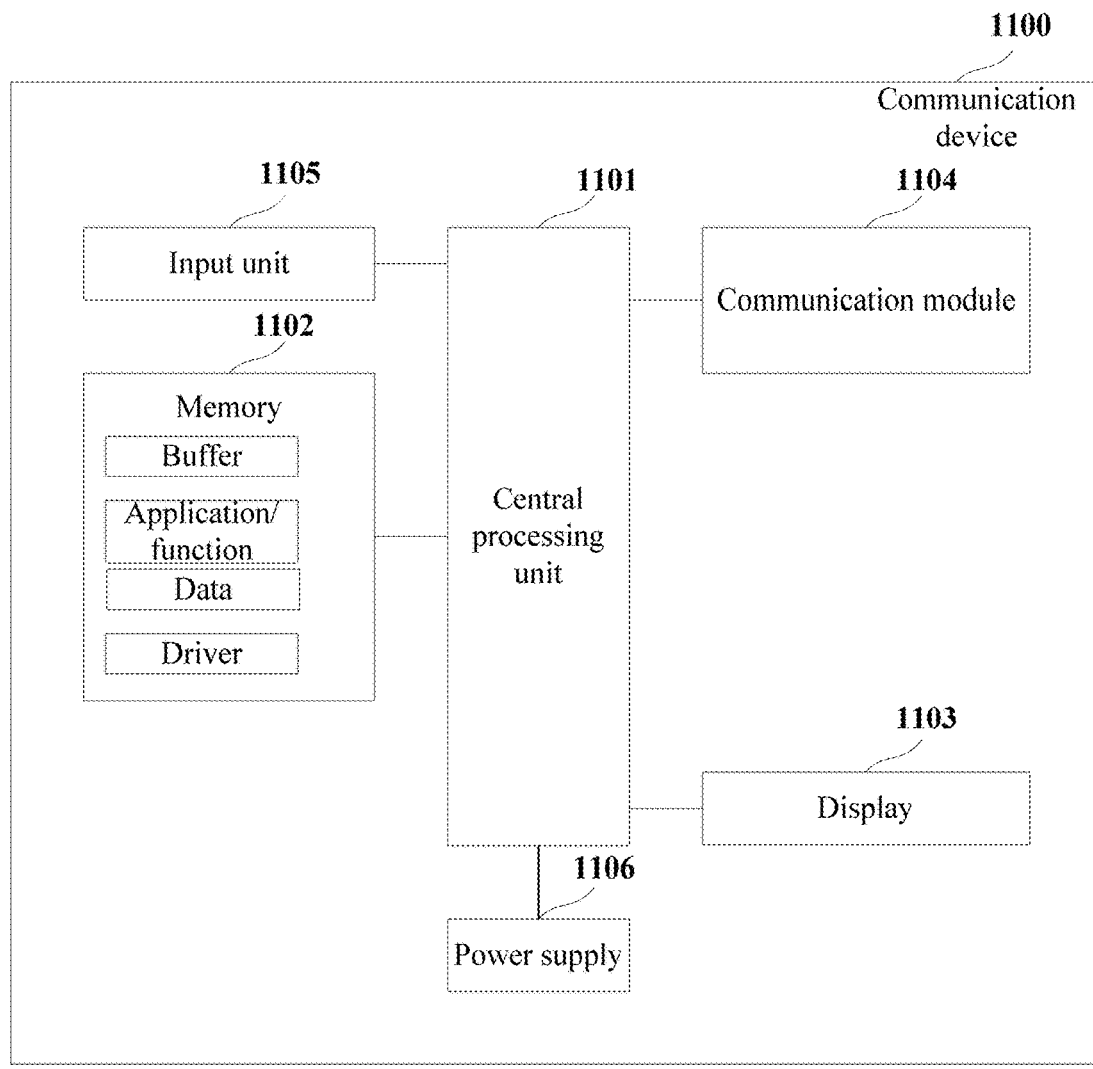
FIG. 11 is a schematic diagram of a structure of the communication device of an embodiment of this disclosure.

FIG. 11 is a schematic diagram of a structure of the communication device of this embodiment. As shown in FIG. 11, a communication device 1100 may include a central processing unit (CPU) 1101 and a memory 1102, the memory 1102 being coupled to the central processing unit 1101. It should be noted that this figure is illustrative only, and other types of structures may also be used, so as to supplement or replace this structure and achieve a telecommunications function or other functions.

In some embodiments, the functions of the phase response measurement apparatus 1001 described in the embodiment of the fourth aspect may be integrated into the central processing unit 1101.

Wherein, the central processing unit 1101 is configured to: after a first signal passes through a narrowband photodetector, perform frequency mix of the first signal with a first reference signal and a second reference signal respectively and then perform noise reduction, to obtain a first detection signal and a second detection signal; wherein the first signal is obtained after a measurement signal passes through a filtering module of an optical transmitting end, the measurement signal being transmitted in a path of multiple branches, signals being not transmitted in other paths of the multiple branches, a frame structure of the measurement signal including at least one two-tone signal, two tones in the two-tone signal having a fixed tone interval; calculate group delays at multiple frequency bins according to the first detection signal and the second detection signal; and determine a phase response of the filtering module of the optical transmitting end in the path according to the group delays at multiple frequency bins.

As shown in FIG. 11, the communication device 1100 may further include a communication module 1104, an input unit 1105, a display 1103 and a power supply 1106. It should be noted that the communication device 1100 does not necessarily include all the parts shown in FIG. 11. Furthermore, the communication device 1100 may include parts not shown in FIG. 11, and the relevant art may be referred to.

For example, the communication device 1100 may be a transmitter or a transceiver, in which case the communication device 1100 may also include the modules shown in FIG. 1, and reference may be to FIG. 1 for structures thereof, which shall not be described herein any further. Furthermore, the communication device may include a photodetector and a pre-equalizer, etc. For example, when the communication device is a transceiver, the communication device may also include a receiving end module, such as a demodulator, and reference may be made to the relevant art for details, which shall not be enumerated herein any further.

For example, the central processing unit 1101 is further configured to control the above transmitter to transmit a measurement signal and change a frequency of the measurement signal.

As shown in FIG. 11, the central processing unit 1101 is sometimes referred to as a controller or an operational control, which may include a microprocessor or other processor devices and/or logic devices. The central processing unit 1101 receives input and controls operations of components of the communication device 1100.

Wherein, the memory 1102 may be, for example, one or more of a buffer memory, a flash memory, a hard drive, a mobile medium, a volatile memory, a nonvolatile memory, or other suitable devices, which may store various data, etc., and furthermore, store programs executing related information. And the central processing unit 1101 may execute programs stored in the memory 1102, so as to realize information storage or processing, etc. Functions of other parts are similar to those of the relevant art, which shall not be described herein any further. The parts of the terminal equipment 1100 may be realized by specific hardware, firmware, software, or any combination thereof, without departing from the scope of this disclosure.

In some embodiments, in measuring a phase response, the pre-equalizer of the communication device 1100 is first stopped, and then the transmitter is controlled by the CPU to transmit a measurement signal of different frequencies, the measurement signal passes through transmitting end filtering modules to obtain a first signal, the first signal is transmitted to the phase response measurement apparatus 1101 after passing through the photodetector, and the phase response measurement apparatus 1101 determines the phase response. Optionally, the photodetector may also be provided in the phase response measurement apparatus 1001, and the embodiment of this disclosure is not limited thereto.

It can be seen from the above embodiment that a phase response of a branch path is measured by using the single-path two-tone measurement signal and the built-in photodetector of the optical transceiver. Therefore, no additional measurement instrument is needed to measure the phase response, thereby avoiding the problems of high cost and difficulty of large-scale use brought about by the use of instruments to measure the phase response.

Embodiment of the Sixth Aspect

Figure 12:
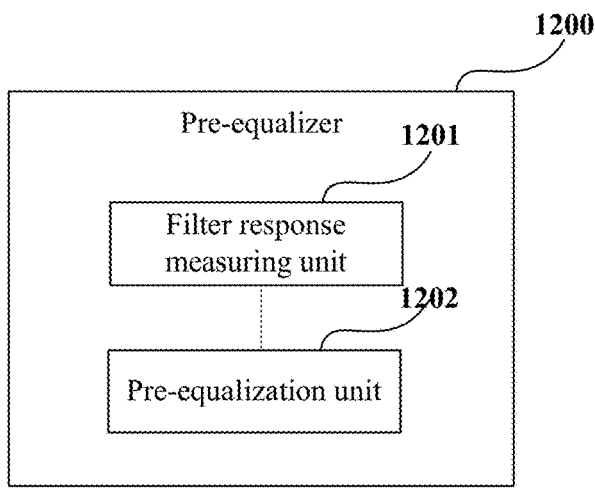
FIG. 12 is a schematic diagram of a structure of a pre-equalizer of an embodiment of this disclosure.

This embodiment provides a pre-equalizer. FIG. 12 is a schematic diagram of a structure of the pre-equalizer of the embodiment of this disclosure. As shown in FIG. 12, a pre-equalizer 1200 includes:

a filter response measuring unit 1201 including the phase response measurement apparatus 700 or 800 of the embodiment of the third aspect and configured to determine a filter response of a transmitting end;

a pre-equalization unit 1202 configured to determine a pre-equalizer coefficient according to the filter response of the transmitting end, and perform pre-equalization processing on a transmit signal by using the pre-equalizer coefficient.

Wherein, reference may be made to the embodiment of the third aspect for implementation of the filter response measurement unit 1201. In addition, the pre-equalization unit 1202 may determine the pre-equalizer coefficient by using such method as zero forcing, and minimum mean square error, etc., and perform pre-equalization processing on a received signal by using a constant modulus algorithm and the coefficient, and this embodiment is not limited thereto.

Embodiment of the Seventh Aspect

Figure 13:
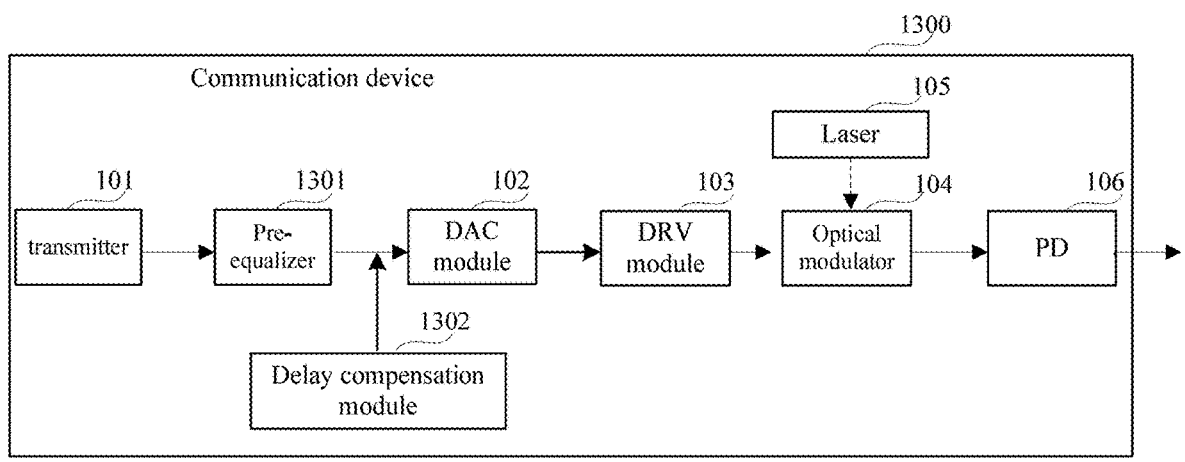
FIG. 13 is a schematic diagram of a structure of the communication device of an embodiment of this disclosure.

The embodiment of this disclosure provides a communication device, which may be a transceiver or a transmitter. FIG. 13 is a schematic diagram of a structure of the communication device in this embodiment. a communication device 1300 includes: a pre-equalizer 1301, reference being able to be made to the pre-equalizer in the embodiment of the sixth aspect for implementation of pre-equalizer 1301, which shall not be described herein any further.

In this case, the communication device may further include the modules shown in FIG. 1, and reference may be made to FIG. 1 for structures thereof, such as the transmitter 101, the digital-to-analog conversion module 102, the DRV module 103, the optical modulator 104, and the laser 105. In addition, the communication device may include a photodetector 106, etc. For example, when the communication device is a transceiver, the communication device may also include a receiving end module, such as a demodulator, and reference may be made to the relevant art for details, which shall not be described herein any further.

In some embodiments, the pre-equalizer calculates a pre-equalization coefficient according to the phase response, and performs pre-equalization processing on a transmitted signal according to the pre-equalization coefficient, and thereafter, there will be relative delays between different branches, which may be measured according to the relevant art, and the embodiment of this disclosure is not limited thereto. The communication device 1300 may further include a delay compensation module 1302, which may apply the measured relative delays to an input signal of the DAC to complete compensation for the relative delays.

An embodiment of this disclosure provides a computer readable program, which, when executed in a phase response measurement apparatus or a communication device, will cause a computer to carry out the phase response measurement method described in the embodiment of the first or second aspect in the phase response measurement apparatus or the communication device.

An embodiment of this disclosure provides a computer storage medium, including a computer readable program, which will cause a computer to carry out the phase response measurement method described in the embodiment of the first or second aspect in a phase response measurement apparatus or a communication device.

The phase response measurement method described in the embodiment of this disclosure carried out in the phase response measurement apparatus or the communication device may be directly embodied as hardware, software modules executed by a processor, or a combination thereof. For example, one or more functional block diagrams and/or one or more combinations of the functional block diagrams shown in FIGS. 7-9 may either correspond to software modules of procedures of a computer program, or correspond to hardware modules. Such software modules may respectively correspond to the steps shown in FIGS. 3, 5 and 6. And the hardware module, for example, may be carried out by firming the soft modules by using a field programmable gate array (FPGA).

The software modules may be located in an RAM, a flash memory, an ROM, an EPROM, and EEPROM, a register, a hard disc, a floppy disc, a CD-ROM, or any memory medium in other forms known in the art. A memory medium may be coupled to a processor, so that the processor may be able to read information from the memory medium, and write information into the memory medium; or the memory medium may be a component of the processor. The processor and the memory medium may be located in an ASIC. The soft modules may be stored in a memory of a mobile terminal, and may also be stored in a memory card of a pluggable mobile terminal. For example, if equipment (such as a mobile terminal) employs an MEGA-SIM card of a relatively large capacity or a flash memory device of a large capacity, the soft modules may be stored in the MEGA-SIM card or the flash memory device of a large capacity.

One or more functional blocks and/or one or more combinations of the functional blocks in FIGS. 7-9 may be realized as a universal processor, a digital signal processor (DSP), an application-specific integrated circuit (ASIC), a field programmable gate array (FPGA) or other programmable logic devices, separate gate or transistor logic devices, separate hardware component or any appropriate combinations thereof carrying out the functions described in this application. And the one or more functional block diagrams and/or one or more combinations of the functional block diagrams in FIGS. 2, 3, 5 and 6 may also be realized as a combination of computing equipment, such as a combination of a DSP and a microprocessor, multiple processors, one or more microprocessors in communication combination with a DSP, or any other such configuration.

This disclosure is described above with reference to particular embodiments. However, it should be understood by those skilled in the art that such a description is illustrative only, and not intended to limit the protection scope of the present invention. Various variants and modifications may be made by those skilled in the art according to the principle of the present invention, and such variants and modifications fall within the scope of the present invention.

According to the implementations disclosed in the embodiments of this disclosure, following supplements are further disclosed.

1. A phase response measurement apparatus, characterized in that the apparatus includes: a first processing unit configured to, after a first signal passes through a narrow-band photodetector, perform frequency mix of the first signal with a first reference signal and a second reference signal respectively and then perform noise reduction, to obtain a first detection signal and a second detection signal; wherein the first signal is obtained after a measurement signal passes through a filtering module of an optical transmitting end, the measurement signal being transmitted in a path of multiple branches, signals being not transmitted in other paths of the multiple branches, a frame structure of the measurement signal including at least one two-tone signal, two tones in the two-tone signal having a fixed tone interval; a first calculating unit configured to calculate group delays at multiple frequency bins according to the first detection signal and the second detection signal; and a first determining unit configured to determine a phase response of the filtering module of the optical transmitting end in the path according to the group delays at multiple frequency bins.

2. The apparatus according to supplement 1, wherein the first reference signal and the second reference signal are $\cos(d\omega \times t+\delta)$ and $\sin(d\omega \times t+\delta)$, respectively; where, $d\omega$ is the tone interval, and $\delta$ is an initial phase of the first reference signal and/or the second reference signal relative to the measurement signal.

3. The apparatus according to supplement 1, wherein the apparatus further includes: a first controlling unit configured to change the two tones in the two-tone signal so that the first processing unit obtains a first detection signal and a second detection signal corresponding to multiple frequency bins; the first calculating unit calculates a phase of a beat frequency according to the first detection signal and the second detection signal corresponding to multiple frequency bins, and determines the group delays at multiple frequency bins according to the phase of the beat frequency, and the first determining unit performs integration on the group delays at multiple frequency bins to determine the phase response of the filtering module of the optical transmitting end in the path.

4. The apparatus according to supplement 1, wherein an optical modulator in the filtering module of the optical transmitting end only sets DC bias of the path to be near a null point.

5. The apparatus according to supplement 1, wherein the frame structure of the measurement signal includes at least two (N) two-tone signals, tone intervals between two tones in each two-tone signal being the same.

6. The apparatus according to supplement 5, wherein the first calculating unit calculates group delays at multiple (N) frequency bins to which a measurement signal of a current frame structure corresponds, the group delays at multiple frequency bins constituting a group delay segment corresponding to the current frame structure, and the apparatus further includes: a second controlling unit configured to change two tones in each two-tone signal in the measurement signal of the current frame structure so that the first calculating unit calculates separate group delay segments to which measurement signals of different frame structures correspond; wherein lowest tones of two measurement signals used for measuring neighboring group delay segments are different; and a splicing unit configured to splice the separate group delay segments according to group delays at overlapped frequency bins obtained by measurement of overlapped two-tone signals; wherein two measurement signals used for measuring neighboring group delay segments containing at least one same overlapped two-tone signal; and the first determining unit determines the phase response of the filtering module of the optical transmitting end in the path according to the spliced group delay segments.

7. The apparatus according to supplement 6, wherein the splicing unit calculates an average value of a difference between group delays at all or part of the overlapped frequency bins of two neighboring group delay segments, and changes group delays at frequency bins on one of the two neighboring group delay segments according to the average value so that the two neighboring group delay segments are connected end to end; or the splicing unit takes an average value of group delays at overlapped frequency bins of two neighboring group delay segments as spliced group delays of the overlapped frequency bins, and changes group delays at frequency bins on the two neighboring group delay segments according to the average value so that the two neighboring group delay segments are connected end to end.

8. The apparatus according to supplement 6, wherein the first calculating unit includes: a first calculating module configured to calculate according to the first detection signal and the second detection signal to obtain phases of beat frequencies of different two-tone signals in the current frame structure; a first unwrapping module configured to unwrap the phases when hopping occurs in the phases obtained for the same frequency bin in frames of multiple repeated measurement signals to which the current frame structure corresponds; an average unit module configured to calculate an average value of the unwrapped phases obtained for the same frequency bin in frames of multiple repeated measurement signals to which the current frame structure corresponds, and take the average value as a phase for the same frequency bin; a second unwrapping module configured to unwrap the phases obtained at the frequency bins in the current frame structure to obtain the phases to which the frequency bins in the current frame structure correspond; and an integration module configured to determine a group delay segment to which the measurement signal of the current frame structure corresponds according to the phases to which the frequency bins in the current frame structure correspond.

9. The apparatus according to supplement 8, wherein the first calculating unit further includes: a first processing module configured to calculate a slope of a curve constituted by the unwrapped phases obtained for the same frequency bin in frames of multiple repeated measurement signals to which the current frame structure corresponds, and remove the slope from the phases, or calculate a frequency difference of reference signals and/or a frequency bias of a sampling clock according to the slope, and update the first reference signal and the second reference signal according to a result of calculation.

10. A phase response measurement method, characterized in that the method includes: transmitting a measurement signal in a path of multiple branches, and not transmitting a signal in other paths of the multiple branches, a frame structure of the measurement signal including at least one two-tone signal, two tones in the two-tone signal having a fixed tone interval; obtaining a first signal by passing the measurement signal through a filtering module of an optical transmitting end; after the first signal passes through a narrowband photodetector, performing frequency mixing of the first signal with a first reference signal and a second reference signal respectively and then performing noise reduction, to obtain a first detection signal and a second detection signal; calculating group delays at multiple frequency bins according to the first detection signal and the second detection signal; and determining a phase response of the filtering module of the optical transmitting end in the path according to the group delays at multiple frequency bins.

11. The method according to supplement 10, wherein the first reference signal and the second reference signal are $\cos(d\omega \times t+\delta)$ and $\sin(d\omega \times t+\delta)$, respectively; where, $d\omega$ is the tone interval, and $\delta$ is an initial phase of the first reference signal and/or the second reference signal relative to the measurement signal.

12. The method according to supplement 10, wherein the method further includes: changing the two tones in the two-tone signal to obtain a first detection signal and a second detection signal corresponding to multiple frequency bins; and calculating a phase of a beat frequency according to the first detection signal and the second detection signal corresponding to multiple frequency bins, determining the group delays at multiple frequency bins according to the phase of the beat frequency, and performing integration on the group delays at multiple frequency bins to determine the phase response of the filtering module of the optical transmitting end in the path.

13. The method according to supplement 10, wherein an optical modulator in the filtering module of the optical transmitting end only sets DC bias of the path to be near a null point.

14. The method according to supplement 13, wherein the frame structure of the measurement signal includes at least two (N) two-tone signals, tone intervals between two tones in each two-tone signal being the same.

15. The method according to supplement 14, wherein group delays at multiple (N) frequency bins to which a measurement signal of a current frame structure corresponds are calculated, the group delays at multiple frequency bins constituting a group delay segment corresponding to the current frame structure, and the method further includes: changing two tones in each two-tone signal in the measurement signal of the current frame structure to calculate separate group delay segments to which measurement signals of different frame structures correspond; wherein lowest tones of two measurement signals used for measuring neighboring group delay segments are different; and splicing the separate group delay segments according to group delays at overlapped frequency bins obtained by measurement of overlapped two-tone signals; wherein two measurement signals used for measuring neighboring group delay segments containing at least one same overlapped two-tone signal; and determining the phase response of the filtering module of the optical transmitting end in the path according to the spliced group delay segments.

16. The method according to supplement 15, wherein the splicing the separate group delay segments according to group delays at overlapped frequency bins obtained by measurement of overlapped two-tone signals includes: calculating an average value of a difference between group delays at all or part of the overlapped frequency bins of two neighboring group delay segments, and changing group delays at frequency bins on one of the two neighboring group delay segments according to the average value so that the two neighboring group delay segments are connected end to end; or taking an average value of group delays at overlapped frequency bins of two neighboring group delay segments as spliced group delays of the overlapped frequency bins, and changing group delays at frequency bins on the two neighboring group delay segments according to the average value so that the two neighboring group delay segments are connected end to end.

17. The method according to supplement 15, wherein the calculating group delays at multiple frequency bins according to the first detection signal and the second detection signal includes: calculating according to the first detection signal and the second detection signal to obtain phases of beat frequencies of different two-tone signals in the current frame structure; unwrapping the phases when hopping occurs in the phases obtained for the same frequency bin in frames of multiple repeated measurement signals to which the current frame structure corresponds; taking an average value of the unwrapped phases obtained for the same frequency bin in frames of multiple repeated measurement signals to which the current frame structure corresponds as a phase for the same frequency bin; unwrapping the phases obtained at the frequency bins in the current frame structure to obtain the phases to which the frequency bins in the current frame structure correspond; and determining a group delay segment to which the measurement signal of the current frame structure corresponds according to the phases to which the frequency bins in the current frame structure correspond.

18. The method according to supplement 17, wherein the calculating group delays at multiple frequency bins according to the first detection signal and the second detection signal further includes: calculating a slope of a curve constituted by the unwrapped phases obtained for the same frequency bin in frames of multiple repeated measurement signals to which the current frame structure corresponds; and removing the slope from the phases, or calculating a frequency difference of reference signals and/or a frequency bias of a sampling clock according to the slope, and update the first reference signal and the second reference signal according to a result of calculation.

The invention claimed is:

1. A phase response measurement apparatus, comprising: a memory to store instructions; and
a computing hardware coupled to the memory to:
after a first signal passes through a narrowband photodetector, perform frequency mix of the first signal with a first reference signal and a second reference signal respectively and then perform noise reduction, to obtain a first detection signal and a second detection signal;
wherein the first signal is obtained after a measurement signal passes through a filtering module of an optical transmitting end, the measurement signal being transmitted in a path of multiple branches, signals not being transmitted in other paths of the multiple branches, a frame structure of the measurement signal including at least one two-tone signal, two tones in the two-tone signal having a fixed tone interval;
calculate group delays at multiple frequency bins according to the first detection signal and the second detection signal; and
determine a phase response of the filtering module of the optical transmitting end in the path according to the group delays at multiple frequency bins.

2. The apparatus according to claim 1, wherein the first reference signal and the second reference signal are cos(dω×t+δ) and sin(dω×t+δ), respectively;
where, dω is the tone interval, and δ is an initial phase of the first reference signal and/or the second reference signal relative to the measurement signal.

3. The apparatus according to claim 1, wherein the computing hardware is further to:
change the two tones in the two-tone signal to obtain the first detection signal and the second detection signal corresponding to the multiple frequency bins;
calculate a phase of a beat frequency according to the first detection signal and the second detection signal corresponding to the multiple frequency bins, and determine the group delays at the multiple frequency bins according to the phase of the beat frequency, and perform integration on the group delays at the multiple frequency bins to determine the phase response of the filtering module of the optical transmitting end in the path.

4. The apparatus according to claim 1, wherein an optical modulator in the filtering module of the optical transmitting end only sets direct current (DC) bias of the path to be near a null point.

5. The apparatus according to claim 1, wherein the frame structure of the measurement signal includes at least two (N) two-tone signals, tone intervals between two tones in each two-tone signal being the same.

6. The apparatus according to claim 5, wherein the computing hardware is further to calculate group delays at multiple (N) frequency bins to which a measurement signal of a current frame structure corresponds, the group delays at the multiple frequency bins constituting a group delay segment corresponding to the current frame structure, and
change two tones in each two-tone signal in the measurement signal of the current frame structure to calculate separate group delay segments to which measurement signals of different frame structures correspond; wherein lowest tones of two measurement signals used for measuring neighboring group delay segments are different; and
splice the separate group delay segments according to group delays at overlapped frequency bins obtained by measurement of overlapped two-tone signals, wherein two measurement signals used for measuring neighboring group delay segments contain at least one same overlapped two-tone signal;
determine the phase response of the filtering module of the optical transmitting end in the path according to the spliced group delay segments.

7. The apparatus according to claim 6, wherein to splice the separate group delay segments, the computing hardware is further to calculate an average value of a difference between group delays at all or part of the overlapped frequency bins of two neighboring group delay segments, and changes group delays at frequency bins on one of the two neighboring group delay segments according to the average value so that the two neighboring group delay segments are connected end to end; or
takes an average value of group delays at overlapped frequency bins of two neighboring group delay segments as spliced group delays of the overlapped frequency bins, and changes group delays at frequency bins on the two neighboring group delay segments according to the average value so that the two neighboring group delay segments are connected end to end.

8. The apparatus according to claim 6, wherein to calculate the phase of the beat frequency, the computing hardware is further to:
calculate according to the first detection signal and the second detection signal to obtain phases of beat frequencies of different two-tone signals in the current frame structure;
unwrap the phases when hopping occurs in the phases obtained for the same frequency bin in frames of multiple repeated measurement signals to which the current frame structure corresponds;
calculate an average value of the unwrapped phases obtained for the same frequency bin in frames of multiple repeated measurement signals to which the current frame structure corresponds, and take the average value as a phase for the same frequency bin;
unwrap the phases obtained at the frequency bins in the current frame structure to obtain the phases to which the frequency bins in the current frame structure correspond; and
determine a group delay segment to which the measurement signal of the current frame structure corresponds according to the phases to which the frequency bins in the current frame structure correspond.

9. The apparatus according to claim 8, wherein to calculate the phase of the beat frequency, the computing hardware is further to
calculate a slope of a curve constituted by the unwrapped phases obtained for a same frequency bin in frames of multiple repeated measurement signals to which the current frame structure corresponds, and remove the slope from the phases, or calculate a frequency difference of reference signals and/or a frequency bias of a sampling clock according to the slope, and update the first reference signal and the second reference signal according to a result of calculation.

10. A phase response measurement method, comprising:
transmitting a measurement signal in a path of multiple branches, and not transmitting a signal in other paths of the multiple branches, a frame structure of the measurement signal including at least one two-tone signal, two tones in the two-tone signal having a fixed tone interval;
obtaining a first signal by passing the measurement signal through a filtering module of an optical transmitting end;
after the first signal passes through a narrowband photodetector, performing frequency mixing of the first signal with a first reference signal and a second reference signal respectively and then performing noise reduction, to obtain a first detection signal and a second detection signal;
calculating group delays at multiple frequency bins according to the first detection signal and the second detection signal; and
determining a phase response of the filtering module of the optical transmitting end in the path according to the group delays at multiple frequency bins.

11. The method according to claim 10, wherein the first reference signal and the second reference signal are $\cos(d\omega \times t+\delta)$ and $\sin(d\omega \times t+\delta)$, respectively; where, $d\omega$ is the tone interval, and $\delta$ is an initial phase of the first reference signal and/or the second reference signal relative to the measurement signal.

12. The method according to claim 10, wherein the method further includes:
changing the two tones in the two-tone signal to obtain the first detection signal and the second detection signal corresponding to the multiple frequency bins;
calculating a phase of a beat frequency according to the first detection signal and the second detection signal corresponding to the multiple frequency bins;
determining the group delays at the multiple frequency bins according to the phase of the beat frequency; and
performing integration on the group delays at the multiple frequency bins to determine the phase response of the filtering module of the optical transmitting end in the path.

13. The method according to claim 10, wherein an optical modulator in the filtering module of the optical transmitting end only sets DC bias of the path to be near a null point.

14. The method according to claim 13, wherein the frame structure of the measurement signal includes at least two (N) two-tone signals, tone intervals between two tones in each two-tone signal being the same.

15. The method according to claim 14, wherein group delays at multiple (N) frequency bins to which a measurement signal of a current frame structure corresponds are calculated, the group delays at the multiple frequency bins constituting a group delay segment corresponding to the current frame structure, and the method further includes:
changing two tones in each two-tone signal in the measurement signal of the current frame structure to calculate separate group delay segments to which measurement signals of different frame structures correspond; wherein lowest tones of two measurement signals used for measuring neighboring group delay segments are different; and
splicing the separate group delay segments according to group delays at overlapped frequency bins obtained by measurement of overlapped two-tone signals, wherein two measurement signals used for measuring neighboring group delay segments contain at least one same overlapped two-tone signal; and
determining the phase response of the filtering module of the optical transmitting end in the path according to the spliced group delay segments.

16. The method according to claim 15, wherein the splicing the separate group delay segments according to group delays at overlapped frequency bins obtained by measurement of overlapped two-tone signals includes:
calculating an average value of a difference between group delays at all or part of the overlapped frequency bins of two neighboring group delay segments, and changing group delays at frequency bins on one of the two neighboring group delay segments according to the average value so that the two neighboring group delay segments are connected end to end; or
taking an average value of group delays at overlapped frequency bins of two neighboring group delay segments as spliced group delays of the overlapped frequency bins, and changing group delays at frequency bins on the two neighboring group delay segments according to the average value so that the two neighboring group delay segments are connected end to end.

17. The method according to claim 15, wherein the calculating group delays at multiple frequency bins according to the first detection signal and the second detection signal includes:
calculating according to the first detection signal and the second detection signal to obtain phases of beat frequencies of different two-tone signals in the current frame structure;
unwrapping the phases when hopping occurs in the phases obtained for the same frequency bin in frames of multiple repeated measurement signals to which the current frame structure corresponds;
taking an average value of the unwrapped phases obtained for the same frequency bin in frames of multiple repeated measurement signals to which the current frame structure corresponds as a phase for the same frequency bin;
unwrapping the phases obtained at the frequency bins in the current frame structure to obtain the phases to which the frequency bins in the current frame structure correspond; and
determining a group delay segment to which the measurement signal of the current frame structure corresponds according to the phases to which the frequency bins in the current frame structure correspond.

18. The method according to claim 17, wherein the calculating group delays at multiple frequency bins according to the first detection signal and the second detection signal further includes:
calculating a slope of a curve constituted by the unwrapped phases obtained for the same frequency bin in frames of multiple repeated measurement signals to which the current frame structure corresponds; and
removing the slope from the phases, or calculating a frequency difference of reference signals and/or a frequency bias of a sampling clock according to the slope, and update the first reference signal and the second reference signal according to a result of calculation.

\* \* \* \* \*